(12) United States Patent  (10) Patent No.: US 7,078,734 B2
Hiramoto                   (45) Date of Patent:    Jul. 18, 2006

(54) OPTICAL SEMICONDUCTOR DEVICE

(75) Inventor: Aki Hiramoto, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/691,705

(22) Filed: Oct. 24, 2003

(65) Prior Publication Data
US 2004/0245528 A1   Dec. 9, 2004

(30) Foreign Application Priority Data
Jun. 6, 2003 (JP) ............................. 2003-162112
Jul. 14, 2003 (JP) ............................. 2003-273963

(51) Int. Cl.
H01L 29/22 (2006.01)
(52) U.S. Cl. ........................... 257/98; 257/99; 257/100
(58) Field of Classification Search ................ 257/98, 257/99, 100; 313/501, 512; 362/311, 800
See application file for complete search history.

(56) References Cited

U.S. PATENT DOCUMENTS
6,274,924 B1   8/2001   Carey et al. ................ 257/676
6,850,001 B1 * 2/2005   Takekuma ................... 313/501

FOREIGN PATENT DOCUMENTS
JP    A 5-327029    10/1993
JP    09-083018   *  3/1997
JP    A 09-234728    3/1999
JP    A-2000-249811  1/2002

* cited by examiner

Primary Examiner—Sara Crane
(74) Attorney, Agent, or Firm—Cermak & Kenealy, LLP

(57) ABSTRACT

The present invention is directed to a highly reliable optical semiconductor device (1), which comprises an optical semiconductor chip (2) sealed in a surrounding soft resin (3) and in a hard resin (4) harder than the soft resin. The hard resin (4) has an aperture (7b) configured to relieve a state of hermetic sealing for the soft resin (3) and formed in a direction that imposes no optical influence on a function of the optical semiconductor chip (2). The soft resin (3) and the hard resin (4) are employed for double sealing to form the highly reliable optical semiconductor device (1) without providing any space. This is effective to solve a problem caused in a conventional optical semiconductor device associated with double sealing by soft and hard resins to increase reliability, which requires a space between both resins and results in deteriorated performance, for example, a reduced amount of light.

19 Claims, 3 Drawing Sheets

OPTICAL SEMICONDUCTOR DEVICE

This application claims priority of Japanese patent application No. JP 2003-162112 filed on Jun. 6, 2003 and Japanese patent application No. JP 2003-273963 filed on Jul. 14, 2003.

BACKGROUND OF THE INVENTION

1. Field of the Invention

The present invention relates to an optical semiconductor device using an optical semiconductor chip such as an LED lamp. More particularly, it has an object to provide a structure capable of preventing a semiconductor chip to be damaged from variations in environmental temperature to improve reliability and preventing performance to be deteriorated due to the improved reliability to allow the reliability and the performance to exist together.

2. Description of the Related Art

When an improvement of reliability is intended in a conventional optical semiconductor device, an optical semiconductor chip is sealed in a first, relatively soft resinous member to improve resistances against shock and moisture. Further, the first resinous member is sealed in a second, relatively hard resinous member to improve the mechanical strength. In this way, two resins with different characteristics can be employed together to compensate for a function lacked in one from another to improve the reliability. (See Patent Publication 1: JP-A-05/327029, paragraphs 5–7, FIG. 1, for example).

In the above conventional structure, however, on selection of two resins as described in the above example, the relatively soft resin is commonly selected as the inner resin that directly contacts the optical semiconductor chip and the relatively hard resin as the outer resin to achieve the required mechanical strength.

In such the case, a difference occurs in thermal expansion coefficient between the soft resin and the hard resin. The difference may reach 10 times depending on cases. Under a high-temperature ambient, the soft resin surrounded in the hard resin expands in volume and applies an excessive compressive pressure to the optical semiconductor chip. Therefore, a problem is caused because such the pressure is a factor for characteristic deterioration.

To avoid the problem, in a proposed optical semiconductor device 90 shown in FIG. 5, a space B is provided between a soft resin 91 and a hard resin 92. This space is effective to prevent a compressive stress to be imposed on an optical semiconductor 93 even if a volume expansion occurs in the soft resin 91 as an environmental temperature elevates.

In the above example, the light emitted from (or coming into) the optical semiconductor chip 93 always passes through the space B, that is, air that has a lower refractive index compared to the resin. In this case, reflection occurred at an interface between the resin and the air causes a loss in amount of light, resulting in an output reduction of about 25–35%. Such the output reduction causes a problem associate with deterioration of the performance as the optical semiconductor device.

As for the soft resin 91 and the holder 94, a difference in expansion coefficient between respective materials also causes a problem because it forms peeled or cracked parts in the product.

The holder 94 commonly employs a lead-frame-insert injection-molded product in its structure. In this molding method, strictly, an air layer is interposed between the frame and the insert-molded product. The air layer expands under a high-temperature ambient and applies pressure to the soft resin, which produces bubbles therein. The production of bubbles causes a problem because it lowers the optical output similar to the above case and deteriorates the performance as the optical semiconductor device.

SUMMARY OF THE INVENTION

As specific means for solving the above conventional problems, the present invention provides an optical semiconductor device, which can include an optical semiconductor chip sealed in a surrounding soft resin; a holder formed around the soft resin and integrally with a lead frame; and a covering lens composed of a transparent resin harder than the soft resin. The holder has an aperture configured to relieve a state of hermetic sealing for the soft resin and formed in a direction that imposes no optical influence on a function of the optical semiconductor chip. In the optical semiconductor device, the lead frame may protrude into the aperture of the holder so as to occupy an inner rim of the aperture at a ratio below ½ in length. Thus, the present invention can solve the above problems by improving reliability without deterioration of performance.

BRIEF DESCRIPTION OF THE DRAWINGS

The present invention will be more fully understood from the following detailed description with reference to the accompanying drawings, in which.

DETAILED DESCRIPTION OF THE PREFERRED EMBODIMENTS

Figure 1:
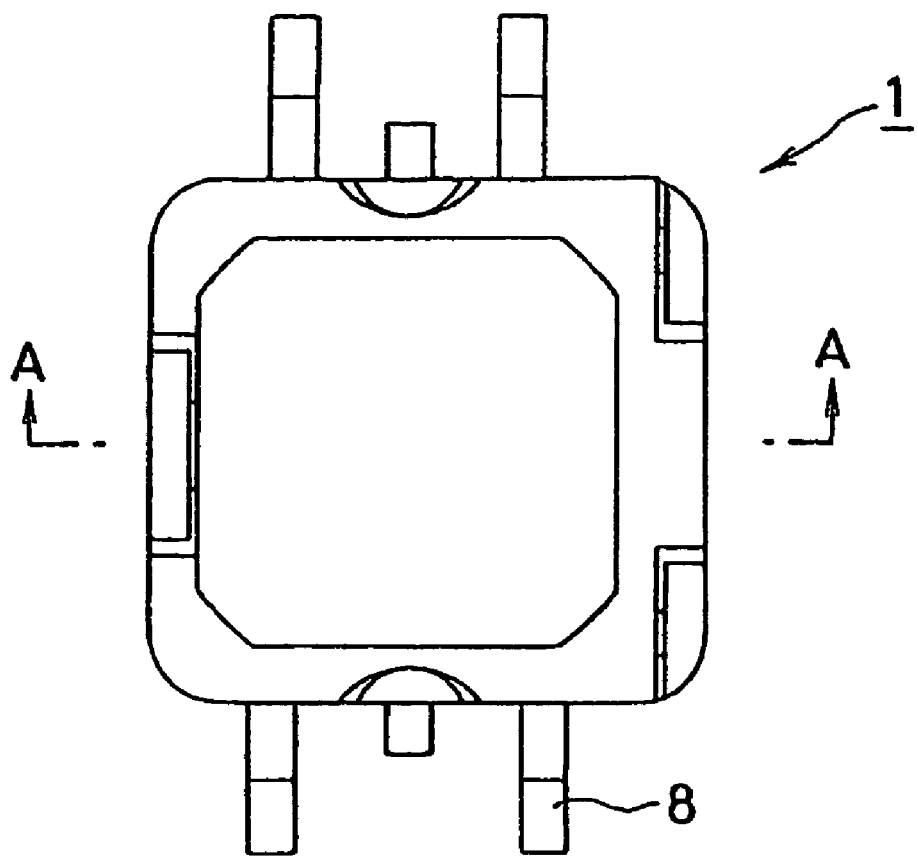
FIG. 1 is a plan view showing an embodiment of an optical semiconductor device according to the present invention.
Figure 2:
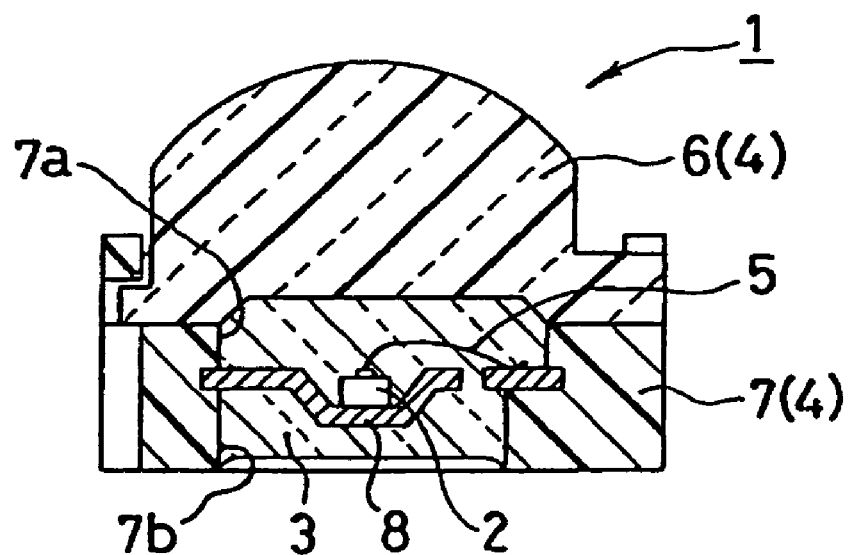
FIG. 2 is a cross-sectional view taken along the A—A line in FIG. 1.

The present invention will be detailed next based on the embodiments shown in the drawings. In FIGS. 1 and 2, the reference numeral 1 denotes an optical semiconductor device according to the present invention. The optical semiconductor device 1 comprises an optical semiconductor chip 2, which is double sealed in a relatively softer soft resin 3 and in a relatively harder hard resin 4 as is in the art.

The optical semiconductor chip 2 is entirely surrounded by the soft resin 3 and blocked from air to prevent the optical semiconductor chip 2 to be deteriorated from moisture in the atmosphere. The optical semiconductor chip 2 is wired through a fine-diameter gold wire 5. Accordingly, it is covered in the soft resin 3 to prevent the gold wire 5 to be broken or peeled from the optical semiconductor chip 2 due to vibrations.

The optical semiconductor chip 2 thus covered in the soft resin 3 is further covered from external by the hard resin 4 to improve the mechanical strength, which prevents deformation of the soft resin 3 due to external stress and further ensures the improvement of reliability. Preferably, the hard resin 4 has a characteristic for reinforcing weaknesses in the soft resin 3 such as a chemical resistance to improve the reliability on other points than the external stress.

If bubbles arise, they can be released from the product to external through the aperture.

The present invention provides an aperture as a means for avoiding an excessive elevation in compressive stress imposed on the optical semiconductor chip 2 caused at a high temperature by a difference in expansion coefficient between the soft resin 3 and the hard resin 4. If the optical semiconductor chip 2 is a light-emitting element, the aperture is provided at a location that is not involved in an optical path for a light emitted from the optical semiconductor chip 2. If the optical semiconductor chip 2 is a photo-detecting element, the aperture is provided at a location that is not involved in an optical path for an external light coming into the optical semiconductor chip 2.

The above structure can be described more specifically. In the actual process of manufacturing the highly reliable optical semiconductor device 1, the part composed of the hard resin 4 is divided into a lens 6 and a holder 7, which are formed previously. The holder 7 is provided with a lead frame 8 for mounting the optical semiconductor chip 2 thereon.

The optical semiconductor chip 2 is mounted on the lead frame 8 integrally formed with the holder 7 and wired via the gold wire 5. The holder 7 is provided with an aperture 7a for mounting the optical semiconductor chip 2, which is formed in the front side, or the side to be combined with the lens 6 as described later. Another aperture 7b is formed in the rear side for relieving the compressive stress imposed on the optical semiconductor chip 2.

After the optical semiconductor chip 2 is mounted as above, the holder 7 is coupled to the lens 6 using an appropriate coupling means such as a hook structure. Accordingly, the aperture 7a provided in front of the optical semiconductor chip 2 is closed by the lens 6, and only the aperture 7b provided at the rear side remains open.

In the present invention, the soft resin 3 such as a silicone resin can be injected through the aperture 7b and, after degassing, heated to achieve an appropriate hardness. Such processes can produce the construction of the present invention. The construction can include the soft resin 3 formed to surround the whole optical semiconductor chip 2 and the hard resin 4 (the lens 6 and the holder 7) formed to surround the soft resin 3 except for the aperture 7b where the optical semiconductor chip 2 does not function.

Figure 3:
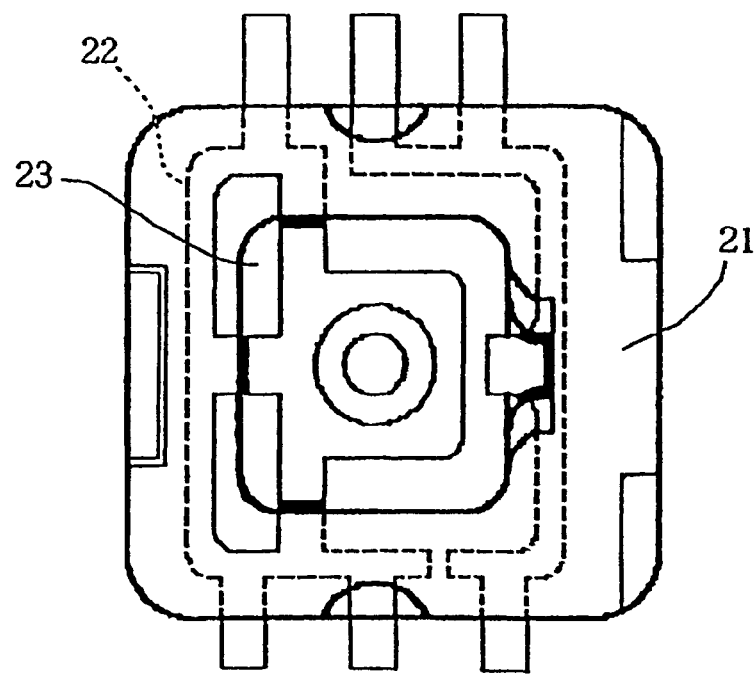
FIG. 3 illustrates a layout of an aperture in a holder and a lead frame.

FIG. 3 shows a layout of the holder 7 of the present invention. The reference numeral 21 denotes a holder, 22 a lead frame, and 23 an aperture. The lead frame 22 protrudes into the aperture 23 in the holder 21 so as to occupy an inner rim of the aperture 23 at a ratio below ½ in length of the inner rim of the aperture 23. The lead frame 22 is so formed by appropriately shaping the part sealed in the holder 21 and the part protruded into the aperture 23.

Figure 4:
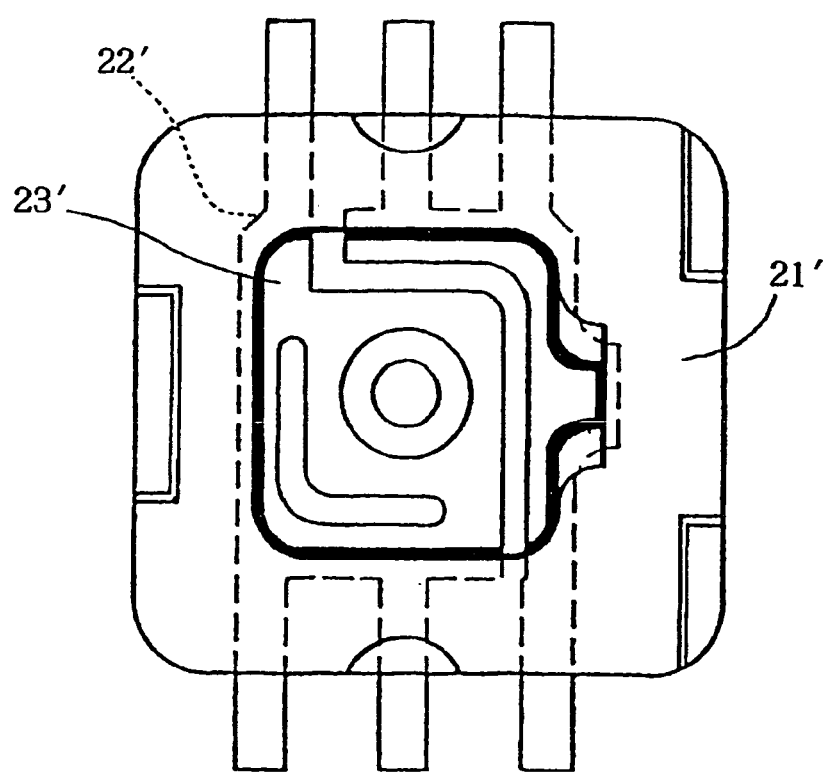
FIG. 4 illustrates the aperture and the lead frame almost entirely contacting the whole rim thereof.
Figure 5:
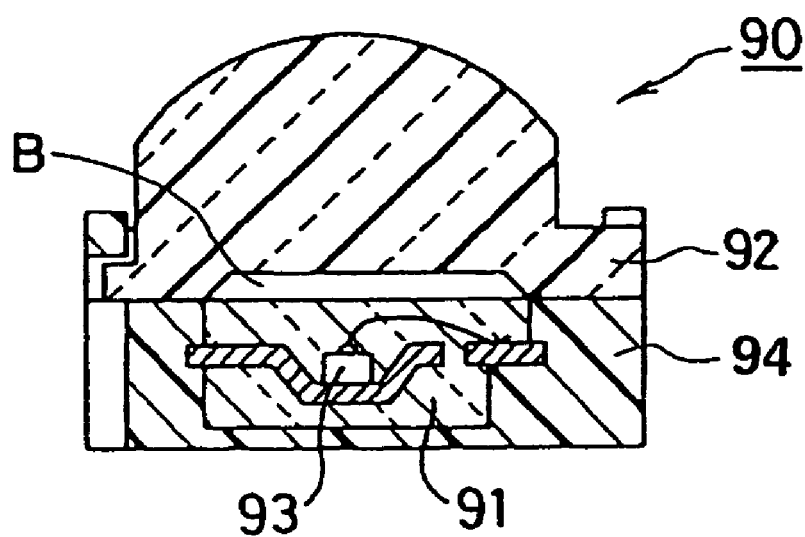
FIG. 5 is across-sectional view of a conventional example.

FIG. 4 shows a reference example, in which a lead frame almost entirely contacts the whole rim of an aperture in a molded holder. The reference numeral 21' denoted a holder, 22' a lead frame, and 23, an aperture.

In the present invention, as shown in FIG. 3, the inner rim of the holder 21, which forms the aperture 23, can include portions (parts of the bold line in FIG. 3) where the lead frame 22 contacts the inner wall of the holder 21. Reducing these portions to be as small as possible is effective to reduce an interface between the lead frame 22 and the holder 21 to prevent production of bubbles. The effect can be confirmed when the lead frame 22 partly contacts the inner wall of the holder in length in the circumferential direction at a ratio below about ½ the length of the inner rim in the holder 21 shown in FIG. 3.

Operation and effect of the highly reliable optical semiconductor device 1 thus configured according to the present invention will be described next. First, the optical semiconductor chip 2 is entirely surrounded by and sealed in the soft resin 3 such as a silicone resin for blocking the atmosphere to prevent deterioration due to moistures and toxic gases. The soft resin 3 is flexible sufficient to protect the optical semiconductor chip 2 from external vibrations.

The hard resin 4 (the lens 6 and the holder 7) is provided with the aperture 7b as described above and accordingly is not configured to hermetically seal the soft resin 3. Therefore, even if the soft resin 3 has a larger thermal expansion coefficient, an extra volume of the soft resin 3 caused from the environmental temperature increase can extend through the aperture 7b and imposes no pressure elevation on the optical semiconductor chip 2.

When a contraction occurs in volume of the soft resin 3 along with the environmental temperature decrease, as the soft resin 3 has a free end in the aperture 7b, its volume can contract without forming any space due to the contraction at another end near the lens 6. Therefore, no air layer is formed in an optical path extending from the optical semiconductor chip 2 through the soft resin 3 to the lens 6 (the hard lens 4). Otherwise, such the air layer causes a loss of about 30%.

It is possible to reduce a contact area between the holder and the soft resin. Therefore, even when a stress arises, its force can escape through the aperture 7b so as to reduce occurrences of peels and cracks in the product relative to the conventional example.

In addition, the inner rim of the holder 21, which forms the aperture 23, includes portions (parts of the bold line in FIG. 3) where the lead frame 22 contacts the inner wall of the holder 21. Reducing such the portions as small as possible is effective to reduce an interface between the lead frame 22 and the holder 21 to prevent production of bubbles. The reduced area of the lead frame 22 in the aperture 23 has an accompanying effect on reduction of a flow resistance against the soft resin injection and relaxation of damage suffered by the gold wire and the optical semiconductor chip 2.

As described above, the optical semiconductor device according to the present invention can include an optical semiconductor chip sealed in a surrounding soft resin; a holder composed of a hard resin harder than the soft resin and formed around the soft resin and integrally with a lead frame; and a covering lens composed of a transparent resin. The holder has an aperture configured to relieve a state of hermetic sealing for the soft resin and formed in a direction that imposes no optical influence on a function of the optical semiconductor chip. In the optical semiconductor device, the lead frame protrudes into the aperture of the holder so as to occupy an inner rim of the aperture at a ratio below ½ in length. Therefore, on formation of a highly reliable optical semiconductor device double sealed with soft and hard resins, the double sealing can be achieved without providing any space that loses reliability. Thus, an extremely superior effect can be expected to improve performance without a loss in amount of the light emitted from or coming into the optical semiconductor chip.

The lead frame can be designed to partly contact the inner wall of the holder in length in the circumferential direction at a ratio below about ½ the length of the inner rim in the holder that forms the aperture. This is effective to reduce the interface between the lead frame 22 and the holder 21 to prevent production of bubbles and make the optical semiconductor device highly reliable. Further, the flow resistance against the soft resin injection is reduced effectively to relax the damage suffered by the gold wire and the optical semiconductor chip.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. An optical semiconductor device, comprising:
   an optical semiconductor chip sealed in a surrounding soft resin;
   a holder formed around said soft resin and adjacent a lead frame; and
   a covering lens composed of a transparent resin, harder than said soft resin, wherein said holder has an aperture configured to form at least one of a space adjacent the soft resin into which the soft resin expands during operation of the semiconductor device and an opening exposed to atmosphere adjacent the soft resin from which the soft resin expands during operation of the semiconductor device, the aperture formed in a direction that imposes substantially no optical influence on a function of said optical semiconductor chip.

2. The optical semiconductor device according to claim 1, wherein said lead frame protrudes into said aperture of said holder so as to occupy an inner rim of said aperture at a ratio below ½ in length.

3. The optical semiconductor device according to claim 1, wherein the holder is made from a hard resin that is harder than the soft resin.

4. The optical semiconductor device according to claim 1, wherein the aperture extends below the optical semiconductor chip.

5. The optical semiconductor device according to claim 4, wherein the aperture defines the space into which the soft resin can expand into during operation of the optical semiconductor device.

6. The optical semiconductor device according to claim 1, wherein the aperture defines the space into which the soft resin can expand into during operation of the optical semiconductor device.

7. The optical semiconductor device according to claim 1, wherein the holder has a bottom surface and the soft resin has a bottom surface, and a portion of the soft resin bottom surface is spaced from the holder bottom surface along an axis of the aperture such that one of the space and the opening is defined in the aperture of the holder.

8. The optical semiconductor device according to claim 7, wherein the optical semiconductor chip is a light emitting device.

9. The optical semiconductor device according to claim 1, wherein the lens is located above the optical semiconductor chip, and the aperture and soft resin are configured such that one of the space and the opening is located below the optical semiconductor chip.

10. An optical semiconductor device, comprising:
    an optical semiconductor chip;
    a soft resin located adjacent the optical semiconductor chip;
    a holder located adjacent the soft resin, wherein the soft resin and the holder form a space located below the optical semiconductor chip, and the space is configured such that the soft resin can expand into the space during operation of the optical semiconductor device;
    a lead frame connected to the semiconductor chip; and
    a covering lens that is harder than the soft resin and located above the optical semiconductor chip.

11. The optical semiconductor device according to claim 10, wherein the holder is formed with an aperture that has an inner periphery, and the lead frame protrudes into the aperture of the holder along less than one half of the inner periphery of the aperture.

12. The optical semiconductor device according to claim 10, wherein the holder includes an aperture that extends below the optical semiconductor chip.

13. The optical semiconductor device according to claim 12, wherein the optical semiconductor chip is a light emitting device.

14. The optical semiconductor device according to claim 10, wherein the holder has a bottom surface and the soft resin has a bottom surface, and a portion of the soft resin bottom surface is spaced from the holder bottom surface to form the space.

15. The optical semiconductor device according to claim 10, wherein the holder includes an aperture that is configured to relieve a state of hermetic sealing for the soft resin and is formed in a direction that imposes no optical influence on a function of the optical semiconductor chip.

16. The optical semiconductor device according to claim 10, wherein the covering lens is immediately adjacent and in contact with the soft resin.

17. An optical semiconductor device, comprising:
    an optical semiconductor chip;
    a soft resin located adjacent the optical semiconductor chip;
    a holder located adjacent the soft resin, wherein the holder forms a space located adjacent the soft resin, and the space is configured such that the soft resin can expand into the space during operation of the optical semiconductor device;
    a lead frame connected to the semiconductor chip; and
    a covering lens that is harder than the soft resin and located above the optical semiconductor chip.

18. The optical semiconductor device according to claim 17, wherein the holder is formed with an aperture, and the lead frame extends into the aperture, and the soft resin is located above and below the lead frame.

19. The optical semiconductor device according to claim 17, wherein the holder includes an aperture that extends below the optical semiconductor chip, and the space is located below the optical semiconductor chip and opens to atmosphere into which the soft resin can expand during operation of the optical semiconductor device.

* * * * *